(12) United States Patent
Brandl

(10) Patent No.: US 9,281,046 B2
(45) Date of Patent: Mar. 8, 2016

(54) DATA PROCESSOR WITH MEMORY CONTROLLER FOR HIGH RELIABILITY OPERATION AND METHOD

(71) Applicant: Advanced Micro Devices, Inc., Sunnyvale, CA (US)

(72) Inventor: Kevin M. Brandl, Austin, TX (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 212 days.

(21) Appl. No.: 14/048,212

(22) Filed: Oct. 8, 2013

(65) Prior Publication Data

US 2015/0100723 A1   Apr. 9, 2015

(51) Int. Cl.
   *G06F 13/16* (2006.01)
   *G11C 11/406* (2006.01)

(52) U.S. Cl.
   CPC ...... *G11C 11/40603* (2013.01); *G06F 13/1605* (2013.01)

(58) Field of Classification Search
   CPC .............. G06F 13/1626; G06F 13/161; G06F 13/1605; G11C 11/40603; G11C 11/40607; G11C 11/40618
   USPC .................................................. 711/106, 167
   See application file for complete search history.

(56) References Cited

U.S. PATENT DOCUMENTS

| 6,496,906 | B1   | 12/2002 | Novak et al. |  |
|---|---|---|---|---|
| 8,127,087 | B2 * | 2/2012  | Blackmon et al. | 711/149 |
| 8,335,896 | B1 * | 12/2012 | Smith | 711/154 |
| 8,843,712 | B1 * | 9/2014  | Smith | 711/159 |
| 2006/0248261 | A1 * | 11/2006 | Jacob et al. | 711/1 |
| 2008/0263302 | A1 | 10/2008 | Balluchi et al. |  |
| 2009/0213670 | A1 | 8/2009 | Ware et al. |  |
| 2009/0248994 | A1 * | 10/2009 | Zheng et al. | 711/151 |
| 2011/0179240 | A1 | 7/2011 | Sukonik et al. |  |
| 2012/0155200 | A1 | 6/2012 | Moon et al. |  |
| 2013/0103897 | A1 | 4/2013 | Rajan et al. |  |
| 2014/0237198 | A1 * | 8/2014 | Fujikami et al. | 711/155 |
| 2014/0269139 | A1 * | 9/2014 | Wang | G11C 11/4063 365/230.03 |

FOREIGN PATENT DOCUMENTS

KR   10-2012-0067509 A   6/2012

OTHER PUBLICATIONS

Scott Mueller, "Upgrading and Repairing PCs, Memory Chapter 6", 19th Edition, Pearson Education, Inc., 2010.*
JEDEC Solid State Technology Association, "DDR4 SDRAM," JESD79-4, Product Specification, 214 pages, Sep. 2012.
International Search Report and Written Opinion for International Application No. PCT/US2014/059227, mailed Dec. 23, 2014, 8 pages.

* cited by examiner

*Primary Examiner* — Pierre-Michel Bataille
(74) *Attorney, Agent, or Firm* — Polansky & Associates, P.L.L.C.; Paul J. Polansky

(57) ABSTRACT

A data processor includes a memory accessing agent and a memory controller. The memory accessing agent generates a plurality of accesses to a memory. The memory controller is coupled to the memory accessing agent and schedules the plurality of memory accesses in an order based on characteristics of the memory. The characteristics of the memory include a row cycle page time ($t_{RCPAGE}$) indicative of an acceptable number of activate commands to a row in the memory within a predetermined time window.

34 Claims, 8 Drawing Sheets

DATA PROCESSOR WITH MEMORY CONTROLLER FOR HIGH RELIABILITY OPERATION AND METHOD

FIELD

This disclosure relates generally to data processing systems, and more specifically to data processors with memory controllers.

BACKGROUND

Computer systems use main memory that is typically formed with inexpensive and high density dynamic random access memory (DRAM) chips. When a first row in a DRAM chip is activated, the contents of the memory cells along the first row are read into a page buffer. Subsequent read and write accesses to memory cells in the first row can take place wholly within the page buffer, without accessing the first row again. When a data processor later accesses a second row in the same memory bank, the memory cells along the row are restored in a precharge operation before the other row can be activated. The data processor may later again access the first row in the same memory bank.

Modern DRAM chips typically store one to eight gigabits (Gb) of data using deep sub-micron technology. Because of the high density and small feature size, rows of the memory are so physically close to other rows that the activation of a particular row can upset data stored in adjacent rows by changing the charge on the memory cell capacitors. Typically these upsets are harmless because the memory cells are refreshed periodically. However occasionally some memory access patterns cause certain rows to be activated and precharged so many times before the next refresh cycle that the memory cells in adjacent rows become corrupted and reverse logic state. After being corrupted, the original data is lost and cannot be restored in subsequent refresh cycles.

Figure 1:
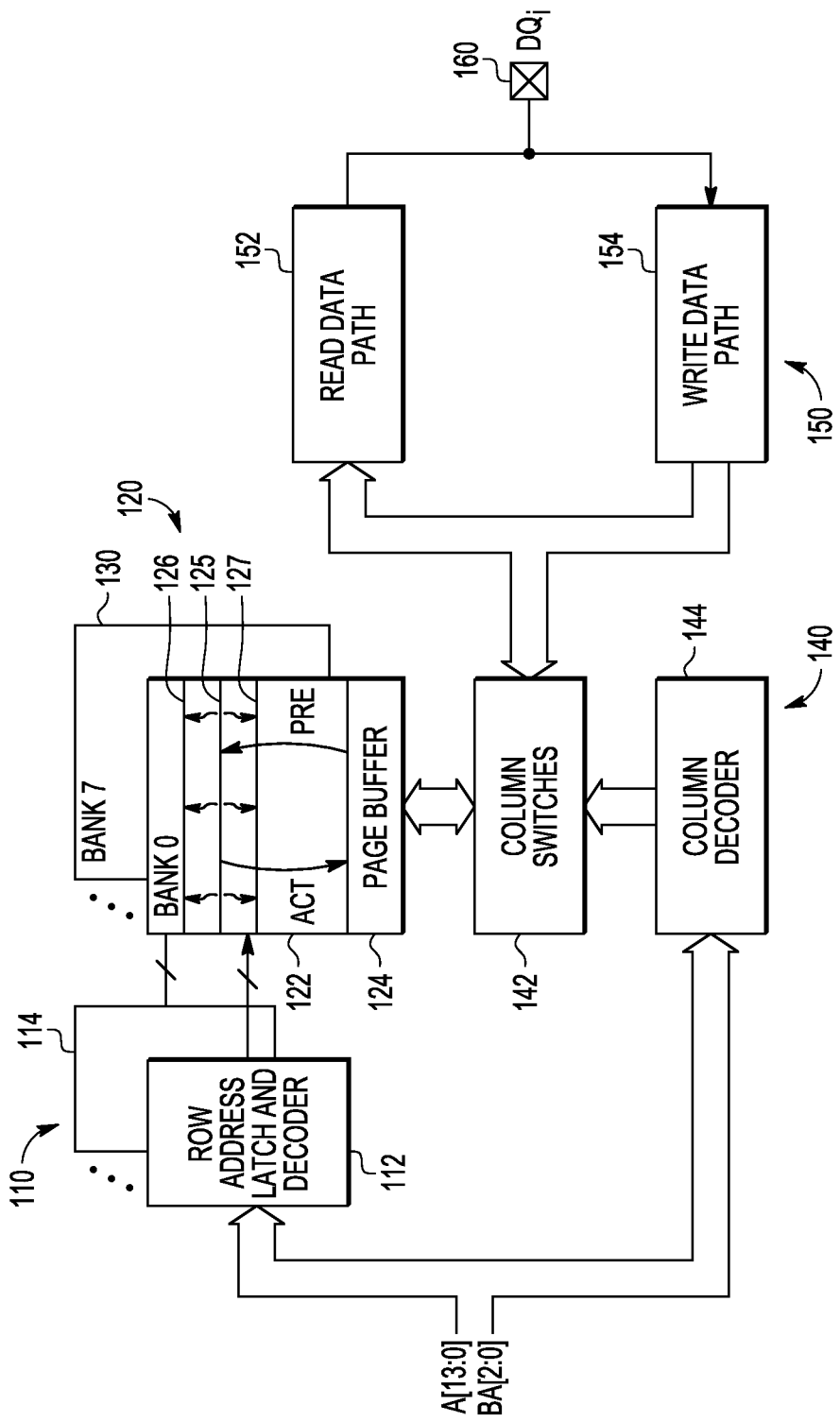
FIG. 1 illustrates in block diagram form a dynamic random access memory (DRAM) susceptible to data upset.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A data processor as disclosed below addresses the data corruption problem with a memory controller that schedules accesses by considering a row cycle page time ($t_{RCPAGE}$). The row cycle page time is indicative of an acceptable number of activate commands to a row in the memory within a predetermined time window. The data processor includes a memory accessing agent for generating accesses to the memory which it provides to the memory controller. The memory controller is coupled to the memory accessing agent and schedules the accesses in an order based on characteristics of the memory, including the row cycle page time.

In one form, a first memory access to a first page of a memory is dispatched. A second memory access to the first page of the memory is received, but dispatching of the second memory access is inhibited until an elapsed time since the dispatching of the first memory access is greater than a row cycle page time.

FIG. 1 illustrates in block diagram form a memory 100 susceptible to data upset. Memory 100 is a dynamic random access memory (DRAM) and generally includes a row path 110, eight memory banks 120, a column circuit 140, a data path 150, and a representative one of a set of data pads 160 labeled "$DQ_i$".

Row path 110 includes a row address latch and decoder for each bank such as a row address latch and decoder 112 for a first bank labeled "BANK 0" and a row address latch and decoder 114 for a last bank labeled "BANK 7". Row path 110 has a set of inputs for receiving a a row address labeled "A[13:0]" and a bank address labeled "BA[2:0]", and a set of outputs. Each of the eight memory banks 120 includes an associated memory array and a page buffer such as memory array 122 and page buffer 124 for BANK 0. Each of the eight memory banks 120 has a set of inputs connected to the set of outputs of a corresponding row address latch and decoder.

Column circuit 140 includes a set of column switches 142 and a column decoder 144. The set of column switches 142 is connected to the page buffer of each of memory banks 120, and has a set of inputs for receiving column selection signals. Column decoder 144 has a set of inputs for receiving a column address conducted on inputs A[13:0] for selecting a column of one of the eight banks selected by BA[2:0], and a set of outputs connected to the inputs of column switches 142.

Data path 150 includes a read data path 152 and a write data path 154. Read data path 152 has a set of inputs connected to column switches 142, and a set of outputs connected to data pads 160. Write data path 154 has a set of inputs connected to data pads 160, and a set of outputs connected to column switches 142.

In operation, memory 100 allows concurrent operations in the memory bank and in one embodiment, memory 100 is compatible with one of the double data rate (DDR) standards published by the Joint Electron Device Engineering Council (JEDEC), such as DDR3 or DDR4. In order to access data, a memory accessing agent such as a data processor activates a row in a memory bank by issuing an activate ("ACT") command. In response to the ACT command, data from memory cells along the selected row such as row 125 in BANK 0 are stored in the corresponding page buffer such as page buffer 124. In DRAMs, data reads are destructive to the contents of the memory cells, but a copy of the data is stored in page buffer 124. After the memory accessing agent finishes accessing data in row 125, it closes the row by issuing a precharge ("PRE") command. The PRE command causes the data in page buffer 124 to be restored to the dynamic memory cells along row 125.

Since memory 100 is a DRAM, the charge in the memory cells slowly leaks, and thus the data must be periodically refreshed. The refresh interval (known as $t_{REFI}$) is based on the amount of time in which weak memory cells will lose their contents due to leakage. For example in DDR4 DRAMs, $t_{REFI}$ is equal to 7.8 microseconds (μs) in typical environments.

In DRAMs formed with modern, deep sub-micron manufacturing processes, repeated activations of a given row can upset the data stored in memory cells in physically adjacent rows. For example, every time row 125 is activated and precharged, the charge in memory cells in adjacent rows 126 and 127 is changed. If row 125 is activated and precharged too many times before memory cells in rows 126 and 127 are refreshed, then their data may become corrupted.

In order to mitigate the data corruption problem without redesigning the memory, the inventor has developed a data processor with a memory controller which schedules accesses by considering the number of times the memory cells in a given row is activated within one refresh interval. For example if the rate of accesses is too high, the memory controller delays the access until after a certain time expires. This time is related to the number of times the memory can be safely accessed within a refresh window.

Figure 2:
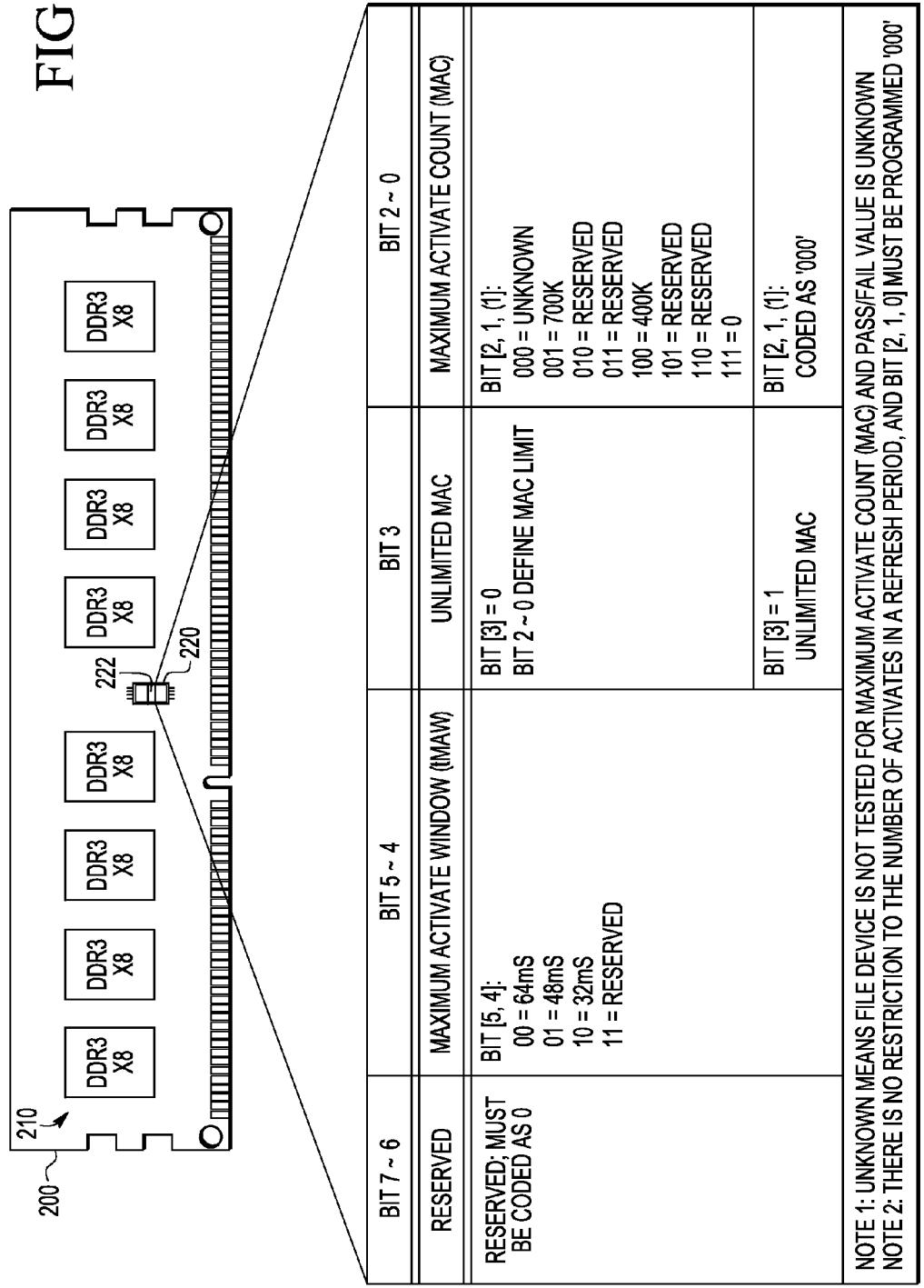
FIG. 2 illustrates a top view of a dual inline memory module (DIMM) that can incorporate the memory of FIG. 1 according to some embodiments.

FIG. 2 illustrates a top view of a dual inline memory module (DIMM) 200 that can incorporate the memory of FIG. 1 according to some embodiments. DIMM 200 generally includes a set of memory chips 210 and a serial presence detect (SPD) read only memory (ROM) 220 on a multi-layer printed circuit board (PCB). Memory chips 210 include eight ×8 memory chips each of which may correspond to memory 100 of FIG. 1. In some embodiments, memory chips 210 are DDR3 SDRAMs. In some embodiments, memory chips 210 are DDR4 SDRAMs.

It should be noted that in some embodiments, DIMM 200 could have a second set of memory devices on the back of the substrate, arranged like memory chips 210. In some embodiments, each memory chip can include a semiconductor package having multiple memory die, using chip-on-chip or stacked die technology, to form more than one rank per chip. Moreover DIMM 200 is representative of a memory system that can use memory chips like memory 100 of FIG. 1. In other embodiments, memory 100 could be used in a single inline memory module (SIMM), or could be mounted on the same PCB as a data processor chip.

SPD ROM 220 stores values to indicate various characteristics of DIMM 200. JEDEC specifies the location and meaning of these bits, for example in standard JESD 21-C, Annex K for DDR3 DRAMs. Recently, an addition to the SPD standard has been proposed which allows manufacturers to specify the susceptibility of memory chips 210 to the data upset problem. Thus as shown in FIG. 2, SPD ROM 220 includes a byte 222 having fields that relate to the data upset characteristics of the memory. Byte 222 is located in an address within SPD ROM 220 that has been reserved by the previous version of the SPD ROM specification, for example at byte $41.

Byte 222 includes bits [7:6] that are reserved, bits [5:4] that define a maximum activate window ($t_{MAW}$), bit [3] labeled "Unlimited MAC", and bits [2:0] that define a maximum activity count (MAC). The meaning of these bits is as follows. When bit [3] is set to "1", rows in memory chips 210 are capable of being activated an unlimited number of times without corrupting the data, and bits [2:0] are coded 000. This setting corresponds to, for example, a design with a data upset that is small enough so that no errors are expected regardless of the ACT rate. When bit [3] is set to "0", bits [2:0] define the MAC over a period defined by $t_{MAW}$ in bits [5:4]. For example as shown in FIG. 2, if bits [5:4]=00, bit [3]=0, and bits [2:0]= 100, then rows in memory chips 210 can be activated up to 400,000 times within a 64 millisecond (ms) window without corruption due to the data upset problem. It should be apparent that storing these characteristics in byte 222 of SPD ROM 220 is just one possible technique of identifying this rate.

As described below, a memory controller is responsive a value known as a row page cycle time ($t_{RCPAGE}$) that is based on the MAC and $t_{MAW}$ to selectively inhibit activates to the same row until the row page cycle time has elapsed since the last activate. By ensuring that that activates do not happen too often, the memory controller is able to avoid data corruption due to the data upset problem.

Figure 3:
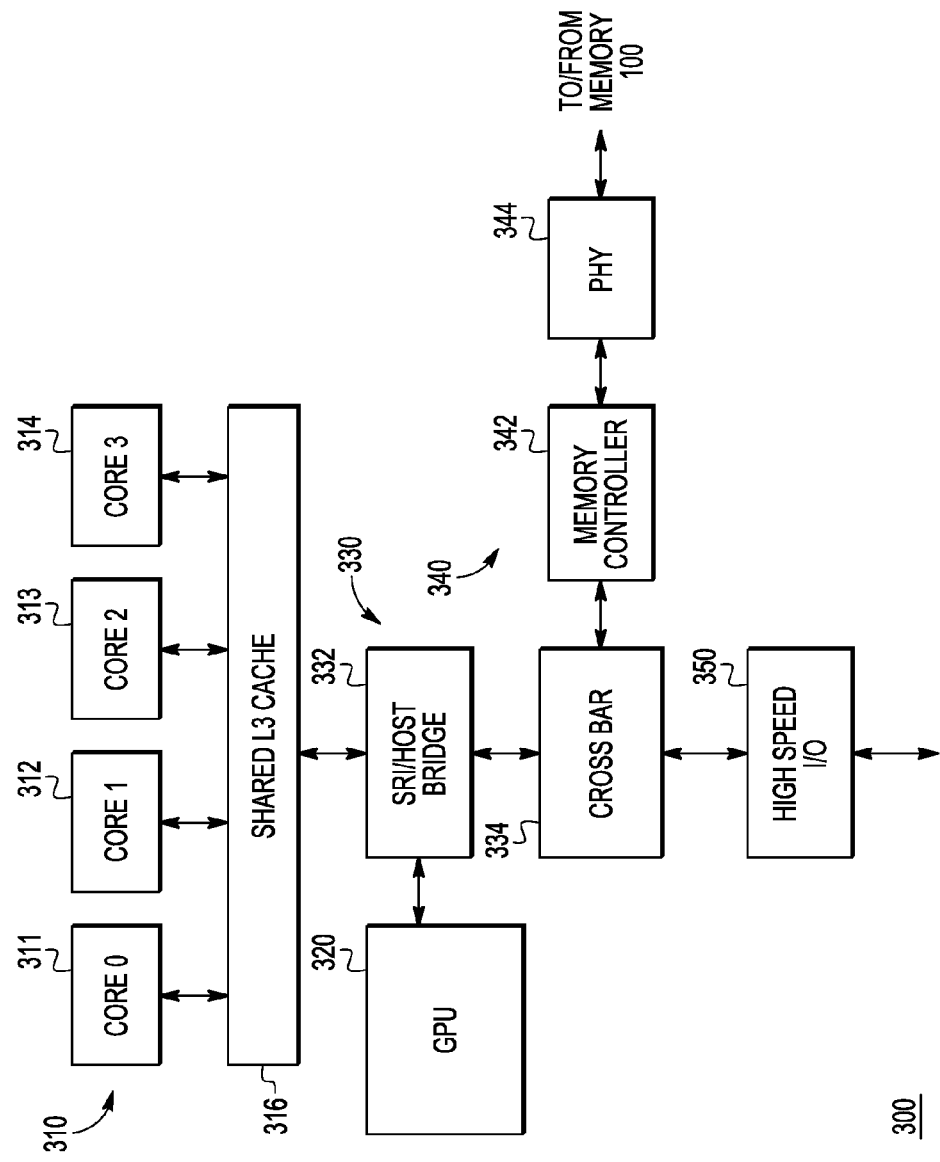
FIG. 3 illustrates in block diagram form a microprocessor with a memory controller according to some embodiments.

FIG. 3 illustrates in block diagram form a data processor 300 with a memory controller 342 according to some embodiments. Data processor 300 generally includes a CPU portion 310, a GPU core 320, an interconnection circuit 330, a memory access controller 340, and an input/output controller 350.

CPU portion 310 includes CPU cores 311-314 labeled "CORE0", "CORE1", "CORE2", and "CORE3", respectively, and a shared level three (L3) cache 316. Each CPU core is capable of executing instructions from an instruction set and may execute a unique program thread. Each CPU core includes its own level one (L1) and level two (L2) caches, but shared L3 cache 316 is common to and shared by all CPU cores. Shared L3 cache 316 operates as a memory accessing agent to provide memory access requests including memory read bursts for cache line fills and memory write bursts for cache line writebacks.

GPU core 320 is an on-chip graphics processor and also operates as a memory accessing agent.

Interconnection circuit 330 generally includes system request interface (SRI)/host bridge 332 and a crossbar 334. SRI/host bridge 332 queues access requests from shared L3 cache 316 and GPU core 320 and manages outstanding transactions and completions of those transactions. Crossbar 334 is a crosspoint switch between five bidirectional ports, one of which is connected to SRI/host bridge 332.

Memory access controller 340 has a bidirectional port connected to crossbar 334 for connection to off-chip DRAM. Memory access controller 340 generally includes a memory controller 342 and a physical interface circuit 344 labeled "PHY". Memory controller 342 generates specific read and write transactions for requests from CPU cores 311-314 and GPU core 320 and combines transactions to related addresses. Memory controller 342 handles the overhead of DRAM initialization, refresh, opening and closing pages, grouping transactions for efficient use of the memory bus, and the like. Physical interface circuit 344 provides an interface to external DRAMs, such as DIMMs by managing the physical signaling. Together memory controller 342 and physical interface circuit 344 support at least one particular memory type, and may support both DDR3 and DDR4.

Input/output controller 350 includes one or more high speed interface controllers. For example, input/output controller may contain three interface controllers that comply with the HyperTransport link protocol.

Data processor 300 includes both CPU cores and a GPU core, and so is known as an accelerated processing unit (APU). This variety of data accessing agents can generate several access patterns that may cause the data upset problem. For example, one of CPU cores 311-314 may run a program thread that strides through data stored in memory in patterns that cause frequent activations of the same memory row.

Another example is when one of CPU cores 311-314 or GPU core 320 repetitively accesses data from the same row and from an uncacheable region. Yet another example is when more than one of CPU cores 311-314 or GPU core 320 accesses and modifies the same data element. In this case, shared L3 cache 316 may follow a policy of updating main memory each time that data modified by one core is accessed by another core. Other scenarios are also possible.

Figure 4:
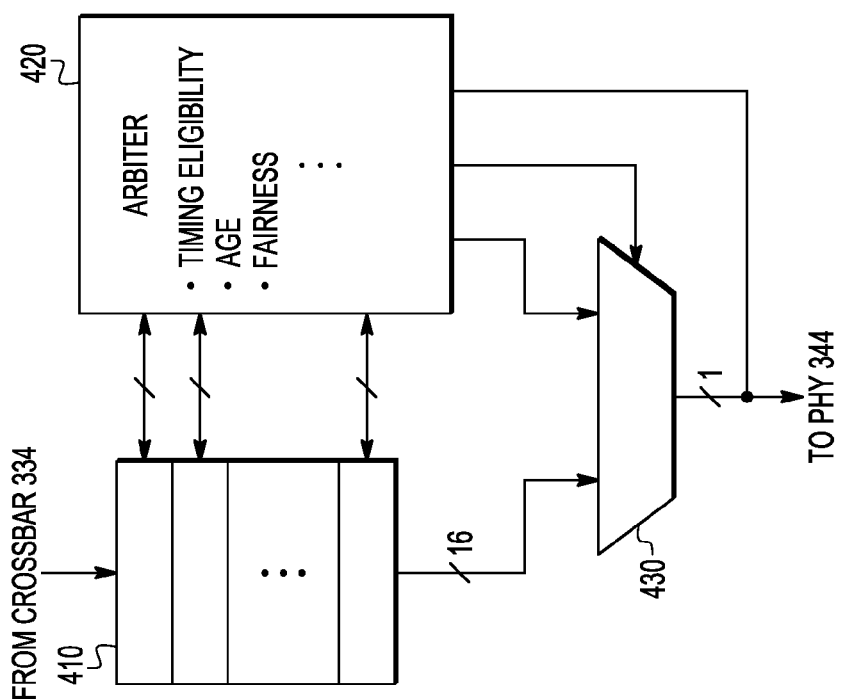
FIG. 4 illustrates in block diagram form the memory controller of FIG. 3 according to some embodiments.

FIG. 4 illustrates in block diagram form memory controller 342 of FIG. 3 according to some embodiments. Memory controller 342 includes a queue 410, an arbiter 420, and a multiplexer 430. Queue 410 stores memory access requests received from crossbar 334. The memory access requests could be read or write cycles to any bank in the memory and are generated by any one of the memory accessing agents in data processor 300. In the example of FIG. 4, queue 410 has a total of 16 entries for all banks and ranks, each entry storing an access address, data in the case of a write cycle, and a tag that indicates its relative age. Arbiter 420 is bidirectionally connected to each entry in queue 410 for reading its attributes, has an additional input for receiving an access as it is dispatched, has an output for providing protocol commands such as ACT and PRE commands, and has a control output for selecting one of the sixteen entries to send to physical interface circuit 344. Multiplexer 430 has sixteen inputs connected to respective entries of queue 410, an additional input connected to the output of arbiter 420, a control input connected to the output of arbiter 420, and an output for providing a dispatched access to physical interface circuit 344.

In operation, queue 410 stores accesses received from crossbar 334 and assigns a tag to indicate its relative age. Arbiter 420 determines which pending access in queue 410 to schedule and dispatch to physical interface circuit 344 based on a set of policies such a timing eligibility, age, and fairness. As such it includes a page table to indicate open pages in each bank and rank of the memory system. In general, arbiter 420 can increase the efficiency of the memory system bus by scheduling multiple accesses to the same row together and delaying an older access to a different row in the same bank. Thus arbiter 420 increases efficiency by selectively deferring accesses to a different row than a currently activated row. Arbiter 420 also uses an entry's age tag to limit the latency of an access. Thus arbiter 420 will interrupt a series of accesses to an open page in memory when an access to another page has been pending for a certain amount of time. Arbiter 420 also schedules accesses to other memory banks in between ACT and PRE commands to a given memory bank to hide the overhead.

Arbiter 420 also determines timing eligibility to avoid data corruption due to the data upset problem caused by repeated ACT and PRE cycles to the same row. Arbiter 420 defines a new timing parameter known as a row cycle page time ($t_{RCPAGE}$) that is inversely proportional to the acceptable number of activate commands to a row in the memory (i.e. MAC) within a predetermined time window ($t_{MAW}$) to avoid data corruption.

In some embodiments, $t_{RCPAGE}$ can be approximated as the time window $t_{MAW}$ divided by the MAC count, or $t_{RCPAGE} = t_{MAW}/\text{MAC}$. For example if the refresh interval is 64 ms, and the MAC count is 400 K, then $t_{RCPAGE} = 64$ ms/400,000=160 nanoseconds (ns). Arbiter 420 can avoid data corruption due to the data upset problem by not dispatching commands that result in ACT commands to the same row within 160 ns windows.

In other embodiments, $t_{RCPAGE}$ can be determined according to a second order calculation by taking into account the refresh time. If each refresh (REF) command consumes a time equal to $t_{RFC}$, then $t_{MAW}$ can be reduced by $t_{RFC}$ times the number of refresh cycles in $t_{MAW}$, or $t_{RCPAGE} = (t_{MAW} - t_{RFC} * (t_{MAW}/t_{REFI}))/\text{MAC}$. An example calculation of $t_{RCPAGE}$ for different DRAM densities of DDR4 DRAM is shown in TABLE I below:

TABLE I

| DRAM | $t_{MAW}$ (ms) | $t_{RC}$ (ns) | $t_{RFC}$ (ns) | # of Refreshes | Refresh Time | Non-refresh time remaining | # of possible ACTs | $t_{RCPAGE}$ 100k (ns) |
|---|---|---|---|---|---|---|---|---|
| 2 Gb DDR4-1600J | 64 | 47.5 | 160 | 8192 | 1310720 | 62689280 | 1319774 | 626.89 |
| 4 Gb DDR4-1600J | 64 | 47.5 | 260 | 8192 | 2129920 | 61870090 | 1302528 | 618.70 |
| 8 Gb DDR4-1600J | 64 | 47.5 | 350 | 8192 | 2867200 | 61132800 | 1287006 | 611.33 |
| 2 Gb DDR4-1600K | 64 | 48.75 | 160 | 8192 | 1310720 | 62689280 | 1285934 | 626.89 |
| 4 Gb DDR4-1600K | 64 | 48.75 | 260 | 8192 | 2129920 | 61870090 | 1269130 | 618.70 |
| 8 Gb DDR4-1600K | 64 | 48.75 | 350 | 8192 | 2867200 | 61132800 | 1254006 | 611.33 |
| 2 Gb DDR4 1866J | 64 | 46.85 | 160 | 8192 | 1310720 | 62689280 | 1338085 | 626.89 |
| 4 Gb DDR4 1866J | 64 | 46.85 | 260 | 8192 | 2129920 | 61870090 | 1320599 | 618.70 |
| 8 Gb DDR4 1866J | 64 | 46.85 | 350 | 8192 | 2867200 | 61132800 | 1304862 | 611.33 |

For example if the refresh interval ($t_{REFI}$) is 7.8 µs (7.8125 µs), then each row will be refresh 8192 times in the reference interval of 64 ms. If the refresh time is 160 ns, then in a 64 ms interval, 1,310,720 ns will be spent in refresh. Thus the effective reference interval is 62,689,280 ns. The theoretical number of ACTs possible in that interval is 62,689,280/$t_{RC}$=1,319,774 possible ACTs. However $t_{RCPAGE}$ is equal to 62,689,280/100,000=626.689 ns. Thus, if the DRAM manufacturer allows only 100K accesses in a reference window of 64 ms, then memory access controller 340 must assure that on average ACTs to the same row occur no more frequently than once every 626.89 ns.

Figure 5:
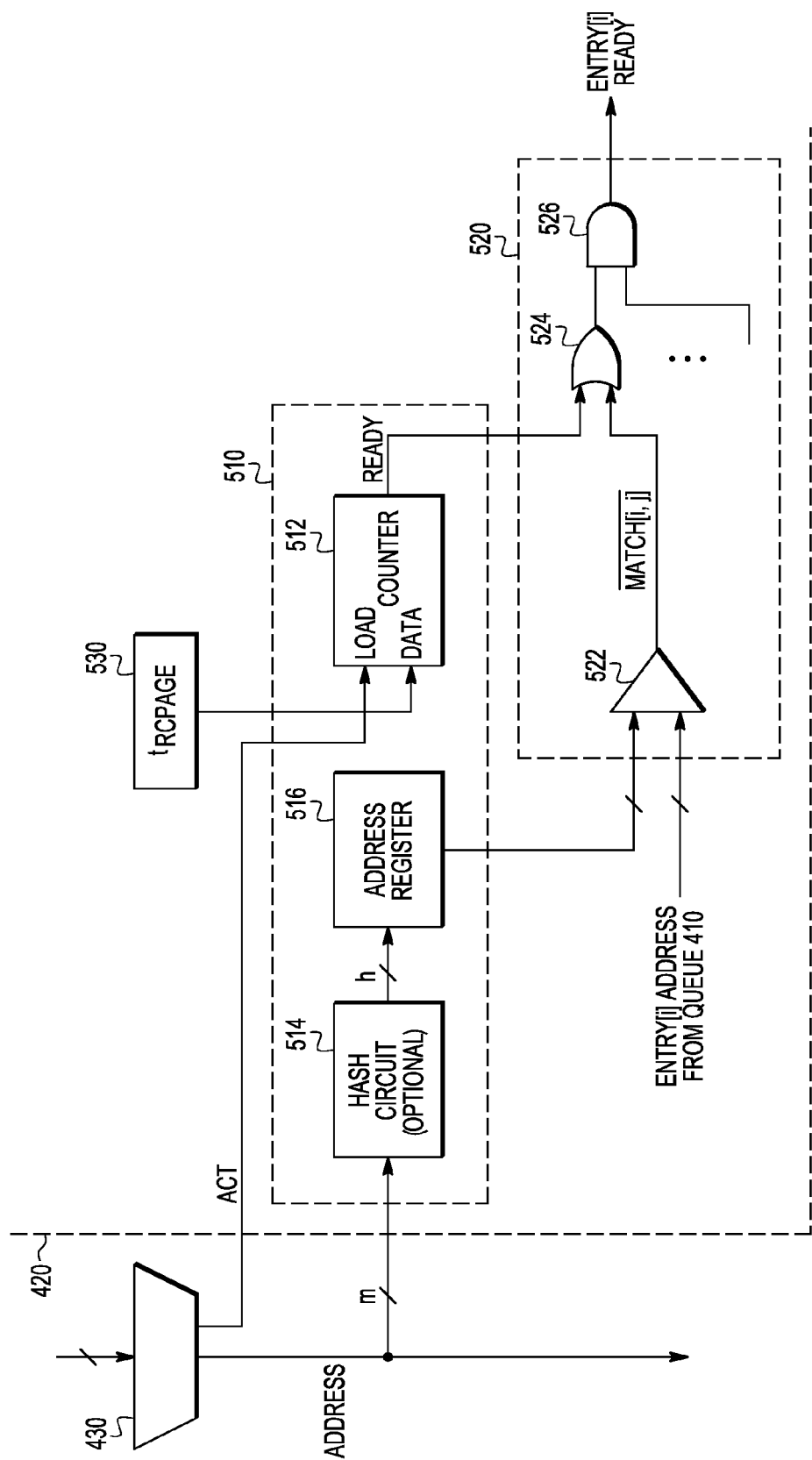
FIG. 5 illustrates in block diagram form a portion of a memory controller such as the memory controller of FIG. 4 according to some embodiments.

FIG. 5 illustrates in block diagram form a portion 500 of a memory controller such as memory controller 400 of FIG. 4 according to some embodiments. Portion 500 shows multiplexer 430 and a portion of arbiter 420 that includes a representative eligibility circuit 510 and a representative entry ready circuit 520.

Eligibility circuit 510 is the $j^{th}$ eligibility circuit and is representative of a set of eligibility circuits. Arbiter 420 only needs enough address registers and counters for the number of possible ACTs whose age is less than $t_{RCPAGE}$, and thus arbiter 420 includes $t_{RCPAGE}/t_{RC}$ such circuits, in which the ratio $t_{RCPAGE}/t_{RC}$ is rounded up to the next whole number. Eligibility circuit 510 includes a counter 512, an optional hash circuit 514, and an address register 516. Counter 512 has a load input for receiving a signal labeled "ACT", a data input, and an output labeled "READY". Hash circuit 514 has an m-bit input for receiving m bits of an address from an output of multiplexer 430, and an output. The m bits are sufficient to determine a unique bank and row of the access. Address register 516 has an n-bit input connected to the output of hash circuit 514, and an n-bit output, and stores an address value for a particular ACT command that arbiter 420 has recently issued.

Entry ready circuit 520 is the $i^{th}$ entry ready circuit and is representative of a set of entry ready circuits corresponding to each entry in queue 410. Entry ready circuit 520 includes a comparator 522, an OR gate 524, and an AND gate 526. Comparator 522 has a first input connected to the output of address register 516, a second input connected to a respective entry of queue 410 for receiving its address, and an output for providing a signal labeled "MATCH[i, j]". OR gate 524 has a first input coupled to the output of counter 512, a second input connected to the output of comparator 522, and an output. AND gate 526 has a first input connected to the output of OR gate 526, additional inputs connected to the outputs of other corresponding OR gates, and an output for providing a signal labeled "ENTRY [i] READY".

Register 530 has an output connected to the data input of counter 512. Register 530 stores the $t_{RCPAGE}$ value in a manner that will be described further below.

In operation, every time an ACT is dispatched from queue 410 through multiplexer 430, multiplexer 430 activates the ACT signal, which loads a counter such as counter 512 of a rotating set of $t_{RCPAGE}/t_{RC}$ eligibility circuits with an the value of $t_{RCPAGE}$. Counter 512 counts down until it reaches zero, at which point it activates the READY signal. If the address in the $i^{th}$ entry of queue 410 matches the address associated with the $j^{th}$ eligibility circuit, then comparator 522 outputs the MATCH[i,j] signal. OR gate 524 outputs a logic high value when either the $j^{th}$ ACT has occurred longer than $t_{RCPAGE}$ ago, or the ENTRY[i] address does not match the address of the $j^{th}$ eligibility circuit. When the outputs of all OR gates in entry ready circuit 520 are a logic high, then AND gate 526 activates signal ENTRY[i] READY at a logic high to indicate that the row corresponding to ENTRY[i] is ready to be activated.

The remaining logic in arbiter 420 receives the ENTRY[i] READY signal and selectively allows the access to take place based on both whether ENTRY[i] READY is active, and when other scheduling constraints are met.

Hash circuit 514 is optional. If present, hash circuit 514 correlates m bits of the input address into a smaller number n of bits of the eligibility circuit. Thus if $t_{RCPAGE}$ becomes large relative to $t_{RC}$, the designer may find it too expensive to implement $t_{RCPAGE}/t_{RC}$ sets of counters and comparators. The hash function could be chosen and sized based on the implemented hardware. Thus it allows a tradeoff between circuit size and occasional false positives. A false positive would occur when both row address X and row address Z hash to the same n-bit address. Thus if $t_{RCPAGE}$ has not yet expired for row X, and the hash functions of row X and row Z are equal, then the access to row Z would need to falsely wait even though the row addresses are indeed different. False positives cause a scheduling penalty.

Figure 6:
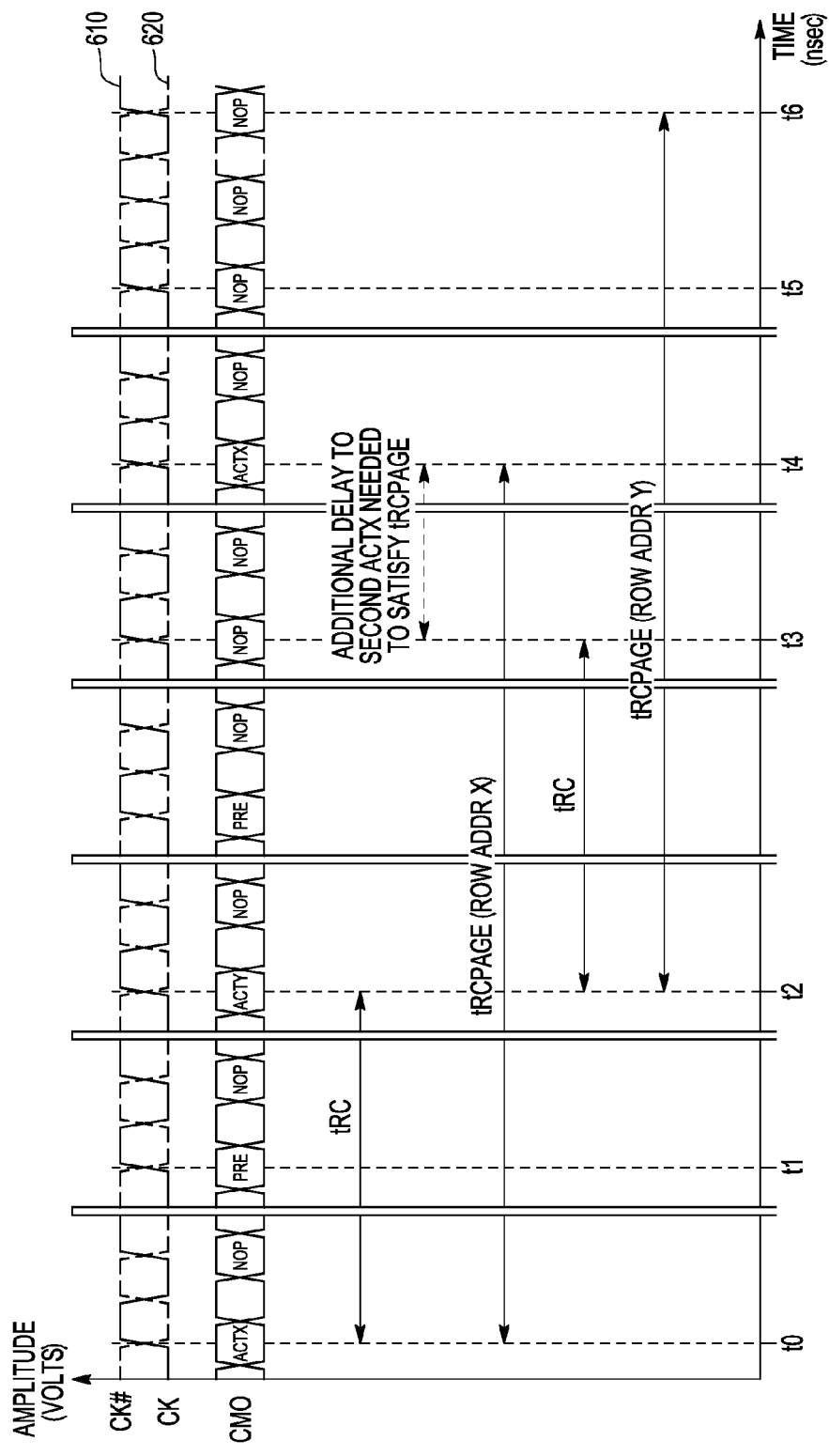
FIG. 6 illustrates a timing diagram useful in understanding the operation of the memory controller of FIG. 4.

FIG. 6 illustrates a timing diagram 600 useful in understanding the operation of the memory controller 400 of FIG. 4. In FIG. 6, the horizontal axis represents time in ns, and the vertical axis represents the amplitude of various signals in volts. FIG. 6 illustrates two signal groups of interest, including a CK/$\overline{CK}$ signal pair 610, and a command (CMD) signal set 620. In DDR DRAMs, the CMD signals are formed by various control signals including $\overline{RAS}$, $\overline{CAS}$, $\overline{CE}$, and $\overline{WE}$ and are mapped to particular commands according to the DDR standards. FIG. 6 also illustrates several time points of interest, including times labeled "$t_0$", "$t_1$", "$t_2$", "$t_3$", "$t_4$", "$t_5$", and "$t_6$".

In DDR DRAMs, commands are registered on the rising edge of CK and the falling edge of $\overline{CK}$. At time $t_0$, memory 100 registers an activate command to row X labeled "ACTX". According to the DDR standard, $t_{RC}$ specifies the minimum amount of time between activate commands. In the example of FIG. 6, the earliest another activate command can occur is at $t_2$. Memory 100 receives a PRE command for row X at time $t_1$. According to the DDR standard, ROW X could again be activated $t_{RC}$ after $t_2$.

However, arbiter 420 also enforces eligibility based on the $t_{RCPAGE}$ parameter. Thus, arbiter 420 prevents ROW X from being activated until $t_{RCPAGE}$ after $t_0$. In this case, ROW X is not eligible to be activated again until $t_4$, thus inserting an additional delay to activate ROW X equal to the time between $t_3$ and $t_4$. Likewise, arbiter 420 prevents ROW Y from being activated until $t_{RCPAGE}$ after $t_2$. In this case, ROW Y is not eligible to be activated again until $t_6$, and if time $t_5$ represents $t_{RC}$ after $t_4$, arbiter 420 inserts an additional delay to activate ROW Y equal to the time between $t_5$ and $t_6$.

Delaying the issuance of new ACT commands based on $t_{RCPAGE}$ will not significantly reduce performance for most memory access patterns since memory controller 400 is able to perform additional useful work while a particular row is not yet eligible for a new ACT command. However it will reduce or eliminate data corruption due to the row upset problem in occasional memory access patterns with a sustained pattern of frequent row activates that would exceed the MAC in $t_{MAW}$. In this scenario, slightly reduced performance will be acceptable in order to prevent data corruption.

Figure 7:
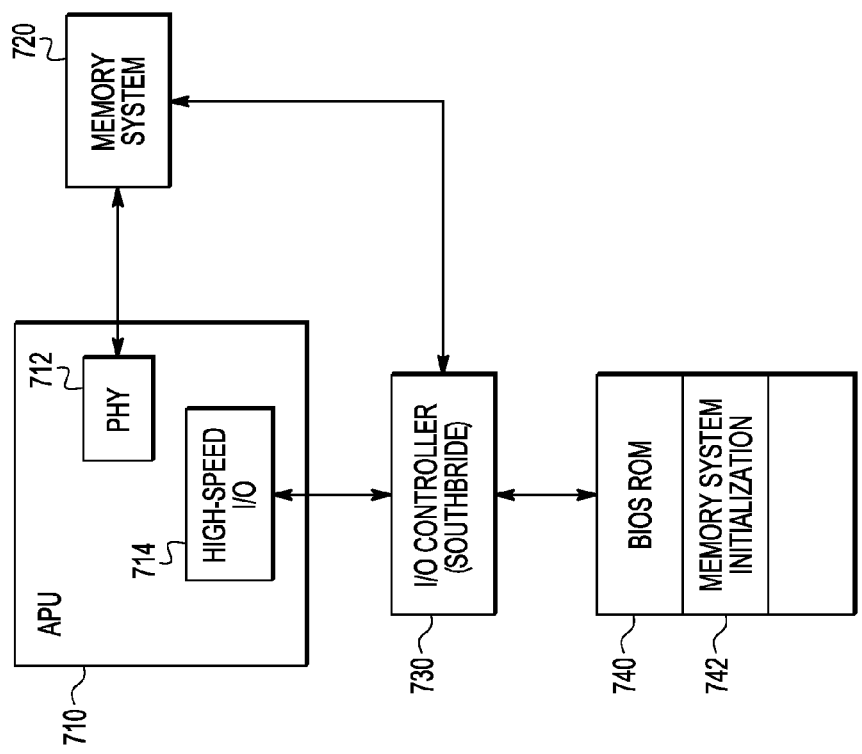
FIG. 7 illustrates in block diagram form a data processing system according to some embodiments.

FIG. 7 illustrates in block diagram form a data processing system 700 according to some embodiments. Data processing system 700 includes a data processor in the form of an accelerated processing unit (APU) 710, a memory system 720, an input/output (I/O) controller known as a "SOUTHBRIDGE" 730, and a basic input output system (BIOS) read only memory (ROM) 740. Data processor 710 has a PHY 712 connected to memory system 720 for carrying out memory access operations. In this example, memory system 720 is a DIMM such as DIMM 200 of FIG. 2 that stores data related to the row upset problem. Data processor 710 is also connected through a high-speed I/O circuit 714 to I/O controller 730, which in turn is connected to both memory system 720 and BIOS ROM 740.

On initialization, data processor 710 initializes data processing system 700 by reading instructions stored in BIOS ROM 740 through I/O controller 730. BIOS ROM 740 includes a memory system initialization portion 742. Memory system initialization portion 742 causes data processor 710 to read the row upset parameters in the SPD ROM in memory system 720, calculate $t_{RCPAGE}$, and store $t_{RCPAGE}$ in register 530.

Figure 8:
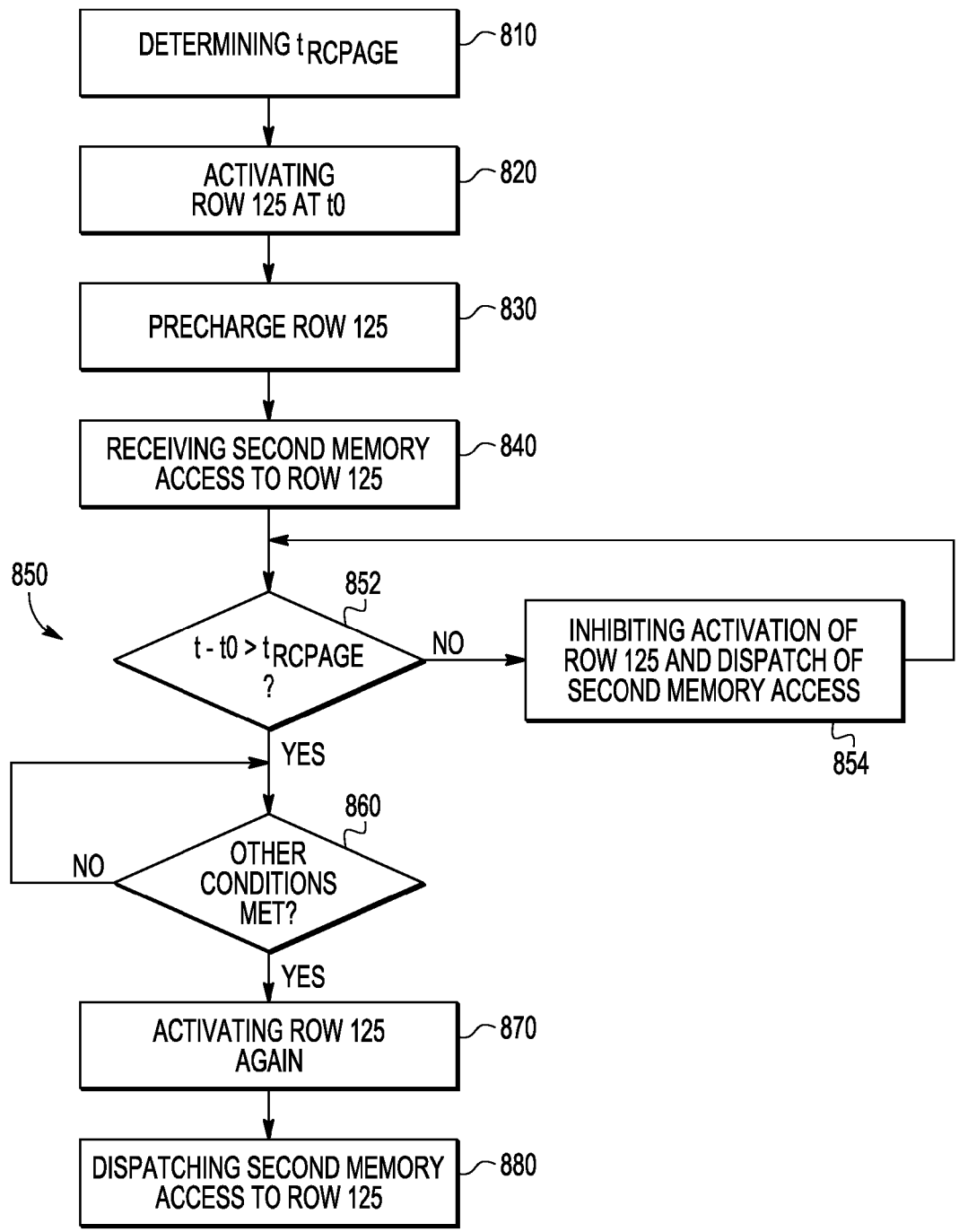
FIG. 8 illustrates a flow chart of a method used in the memory controller of FIG. 4.

FIG. 8 illustrates a flow chart of a method 800 used in memory controller 400 of FIG. 4. At step 810, $t_{RCPAGE}$ is determined, e.g. by reading the SPD ROM on a DIMM under the control of BIOS, and calculating $t_{RCPAGE}$ as described with respect to TABLE I above. In step 820, row 125 is activated at time $t_0$. The activation is performed to open row 125 after a read or write access which is selected from queue 410 by arbiter 420. At step 830, row 125 is precharged due to, for example, an intervening access to another page in the same bank or an intervening refresh operation to the same bank. At step 840, a second memory access to row 125 is received. This second memory access requires a new ACT command due to the intervening PRE command to row 125 at step 830. A loop 850 determines whether row 125 is eligible to be activated. In decision box 852, the elapsed time, i.e. the duration between the current time and time $t_0$, is compared to $t_{RCPAGE}$. This comparison could be accomplished, for example, by starting a counter with a value of $t_{RCPAGE}$ at step 820 and detecting whether the counter has counted down to zero by the time the second memory access is received at step 840 as described with respect to FIG. 5 above. If this time has not elapsed, step 854 inhibits the activation of row 125. If it has, then step 860 determines whether other conditions in the memory system are met. For example, an access to an open page is generally preferred to an access to a new page that requires an ACT command, subject to certain fairness criteria. Finally once the other criteria are satisfied, then at step 870 row 125 is activated again, and at step 880 the second memory access to row 125 is dispatched.

Although in data processor 300 includes a memory controller 342 that determines eligibility using hardware circuits such as an address register, counter, and comparison logic, these functions may be implemented with various combinations of hardware and software. Some of the software components may be stored in a computer readable storage medium for execution by at least one processor. Moreover some or all of the method illustrated in FIG. 8 may also be governed by instructions that are stored in a computer readable storage medium and that are executed by at least one processor. Each of the operations shown in FIG. 8 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Moreover, data processor 300 of FIG. 3 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. The illustrated data processor includes four CPU cores and one GPU core but in other embodiments, the data processor may include a different number of memory accessing agents. Moreover the illustrated data processor includes one memory controller and an associated memory channel, but in other embodiments the data processor may include multiple memory controllers with corresponding memory channels. As noted above, an optional hash circuit can be included in some embodiments to reduce circuit area and excluded in other embodiments to avoid false positives and thus maintain higher performance. In other embodiments, the memory controller can maintain a separate queue for each memory bank. In these embodiments, the number of eligibility circuits and entry ready circuits would increase proportionally. Moreover the $t_{RCPAGE}$ value may be computed to a first order approximation as the refresh interval divided by the MAC count or to a second order by taking into account the refresh time. In addition in some embodiments, the memory controller enforces $t_{RCPAGE}$ memory access scheduling over a relatively long window of time, while still allowing tracking of smaller bursts of activity at the normal $t_{RC}$ rate.

Accordingly, it is intended by the appended claims to cover all modifications of the disclosed embodiments that fall within the scope of the disclosed embodiments.

What is claimed is:

1. A data processing system comprising:
   a data processor;
   a memory system coupled to said data processor; and
   said data processor scheduling a plurality of memory accesses in an order based on characteristics of said memory system, said characteristics of said memory system including a row cycle page time indicative of an acceptable number of activate commands to a row in said memory system within a predetermined time window, wherein said row cycle page time is longer than a minimum time between successive row activations.

2. The data processing system of claim 1, wherein said order is further based on characteristics of recent accesses within said predetermined time window, said characteristics of said recent accesses including a number of activate commands to a particular row within said predetermined time window.

3. The data processing system of claim 1, wherein said memory system comprises a dual inline memory module (DIMM) having a plurality of double data rate (DDR) dynamic random access memories (DRAMs).

4. The data processing system of claim 3, wherein said data processor determines said row cycle page time by reading a register in a serial presence detect (SPD) read only memory (ROM) on said DIMM.

5. The data processing system of claim 4, wherein said data processor reads said register under control of a memory system initialization portion of a basic input-output system (BIOS) stored in a non-volatile memory.

6. The data processing system of claim 5, further comprising:
   an input/output controller coupled between said data processor and said non-volatile memory.

7. The data processing system of claim 1, wherein said data processor determines said row cycle page time by subtracting a periodic refresh time during said predetermined time window from said predetermined time window to obtain a net time window, and dividing said net time window by said acceptable number of activate commands to a row to obtain said row cycle page time.

8. The data processing system of claim 1, wherein said data processor comprises an advanced processor unit (APU) having at least one central processing unit (CPU) core and at least one graphics processing unit (GPU) core.

9. A data processor comprising:
   a memory accessing agent for generating a plurality of accesses to a memory; and
   a memory controller coupled to said memory accessing agent for scheduling said plurality of accesses in an order based on characteristics of said memory, said characteristics of said memory including row cycle page time indicative of an acceptable number of activate commands to a row in said memory within a predetermined time window, wherein said row cycle page time is longer than a minimum time between successive row activations.

10. The data processor of claim 9, wherein said order is further based on characteristics of recent accesses within said predetermined time window, said characteristics of said recent accesses including a number of activate commands to a particular row within said predetermined time window.

11. The data processor of claim 9, wherein said memory comprises a double data rate (DDR) dynamic random access memory (DRAM).

12. The data processor of claim 9, further comprising:
a physical interface circuit coupled between said memory controller and said memory.

13. The data processor of claim 9, wherein said row cycle page time is determined by reading a register associated with said memory.

14. The data processor of claim 13, wherein said memory accessing agent reads said register under control of a memory system initialization portion of a basic input-output system (BIOS) memory.

15. The data processor of claim 9, wherein said memory accessing agent determines said row cycle page time by subtracting a periodic refresh time during said predetermined time window from said predetermined time window to obtain a net time window, and dividing said net time window by said acceptable number of activate commands to said row in said memory to obtain said row cycle page time.

16. The data processor of claim 9, wherein said memory accessing agent comprises at least one central processing unit (CPU) core and at least one graphics processing unit (GPU) core.

17. The data processor of claim 9, wherein said memory controller comprises:
a queue having a plurality of entries for storing memory accesses received from said memory accessing agent; and
an arbiter coupled to said queue for selecting entries from said queue for dispatch to said memory.

18. The data processor of claim 17, wherein:
said arbiter further provides a control signal indicative of which one of said plurality of entries stores a selected access; and
said memory controller further comprises a multiplexer having an input coupled to said plurality entries of said queue, a control input coupled to said arbiter for receiving said control signal, and an output for providing a selected memory access.

19. The data processor of claim 18, wherein said arbiter comprises an eligibility circuit, said eligibility circuit comprising:
an address register for storing an address indicating a row activated by an activate command output by said multiplexer; and
a counter for providing a ready signal when an elapsed time since said row was activated reaches said row cycle page time.

20. The data processor of claim 19, wherein said arbiter further comprises an entry ready circuit coupled to said eligibility circuit for determining whether a corresponding entry of said queue is eligible for selection based on said ready signal when an address of said corresponding entry matches said address, wherein said arbiter selects an entry from said queue among eligible entries.

21. The data processor of claim 20, wherein said eligibility circuit further comprises:

a hash circuit for storing a portion of said address in said addresses register according to a hash function.

22. The data processor of claim 17, wherein said arbiter comprises a plurality of eligibility circuits including said eligibility circuit, said plurality corresponding in number to a ratio of said row cycle page time to a row cycle time.

23. A memory controller comprising:
a queue having a plurality of entries for storing received memory accesses; and
an arbiter coupled to said queue for selecting entries from said queue for dispatch, said arbiter determining eligibility for selection based on a row cycle page time indicative of an acceptable number of activate commands to a row in a memory within a predetermined time window, wherein said row cycle page time is longer than a minimum time between successive row activations.

24. The memory controller of claim 23, wherein:
said arbiter further provides a control signal indicative of which one of said plurality of entries stores a selected access; and
the memory controller further comprises a multiplexer having an input coupled to said plurality entries of said queue, a control input coupled to said arbiter for receiving said control signal, and an output for providing a dispatched memory access.

25. The memory controller of claim 23, wherein said arbiter comprises an eligibility circuit, said eligibility circuit comprising:
an address register for storing an address indicating a row activated by an activate command; and
a counter for providing a ready signal when an elapsed time since said row was activated reaches said row cycle page time.

26. The memory controller of claim 25, wherein said arbiter further comprises an entry ready circuit coupled to said eligibility circuit for determining whether a corresponding entry of said queue is eligible for selection based on said ready signal when an address of said corresponding entry matches said address, wherein said arbiter selects an entry from said queue among eligible entries.

27. The memory controller of claim 25, wherein said eligibility circuit further comprises:
a hash circuit for storing a portion of said address in said addresses register according to a hash function.

28. The memory controller of claim 25, wherein said arbiter comprises a plurality of eligibility circuits including said eligibility circuit, said plurality corresponding in number to a ratio of said row cycle page time to a row cycle time.

29. A method comprising:
activating a row of a memory at a first time;
precharging said row of said memory;
receiving a second memory access to said row of said memory; and
inhibiting activating of said second memory access until an elapsed time since said first time is greater than a row cycle page time, wherein said row cycle page time is indicative of an acceptable number of activate commands to a row in said memory within a predetermined time window and is longer than a minimum time between successive row activations.

30. The method of claim 29, further comprising:
activating said row again after said elapsed time is greater than said row cycle page time; and
dispatching said second memory access to said row.

31. The method of claim 30, further comprising:
determining whether at least one other condition is met; and activating said row again and dispatching said second memory access in response to said determining.

32. The method of claim 29 further comprising:

determining said row cycle page time based on a number of allowed accesses within said predetermined time window.

33. The method of claim 32 wherein said determining comprises:

determining said row cycle page time further based on a refresh time during said predetermined time window.

34. The method of claim 29 wherein said activating said row comprises:

dispatching a first memory access to said row of a double data rate (DDR) dynamic random access memory (DRAM).

* * * * *